United States Patent [19]
Witters

[11] Patent Number: 4,759,081
[45] Date of Patent: Jul. 19, 1988

[54] OPTICAL RECEIVER

[75] Inventor: Hugo F. J. Witters, Berlaar, Belgium

[73] Assignee: Alcatel N.V., Amsterdam, Netherlands

[21] Appl. No.: 817,948

[22] PCT Filed: Apr. 18, 1985

[86] PCT No.: PCT/EP85/00174
§ 371 Date: Dec. 12, 1985
§ 102(e) Date: Dec. 12, 1985

[87] PCT Pub. No.: WO85/04997
PCT Pub. Date: Nov. 7, 1985

[30] Foreign Application Priority Data

Apr. 26, 1984 [BE] Belgium .............................. 2/60399
Oct. 31, 1984 [BE] Belgium .............................. 2/60530

[51] Int. Cl.[4] .................. H04B 9/00; H03F 17/00; H01J 40/14
[52] U.S. Cl. .................................. 455/619; 455/617; 250/214 AG; 330/59
[58] Field of Search ............... 455/617, 619; 330/59, 330/308; 250/214 A, 214 AG

[56] References Cited

U.S. PATENT DOCUMENTS 4,156,135  5/1979  Miller, Jr. et al. ................. 455/619
4,620,321 10/1986  Chown ............................. 330/308

FOREIGN PATENT DOCUMENTS 60-20652  2/1985  Japan ................................. 455/619

Primary Examiner—Robert L. Griffin
Assistant Examiner—Andrew J. Telesz, Jr.
Attorney, Agent, or Firm—Christie, Parker & Hale

[57] ABSTRACT

An optical receiver with a bias circuit (T8, R2/3, R44/45) adapted to reversely bias a photodiode (PIN). This bias circuit for increasing optical power levels shifts the operating point of the photodiode (PIN) towards and into the nonlinear operating region of the photodiode which then becomes forwardly biased and for optical power levels above a predetermined value operates as a constant current source supplying a constant current (Ic) to said photodiode (PIN).

16 Claims, 2 Drawing Sheets

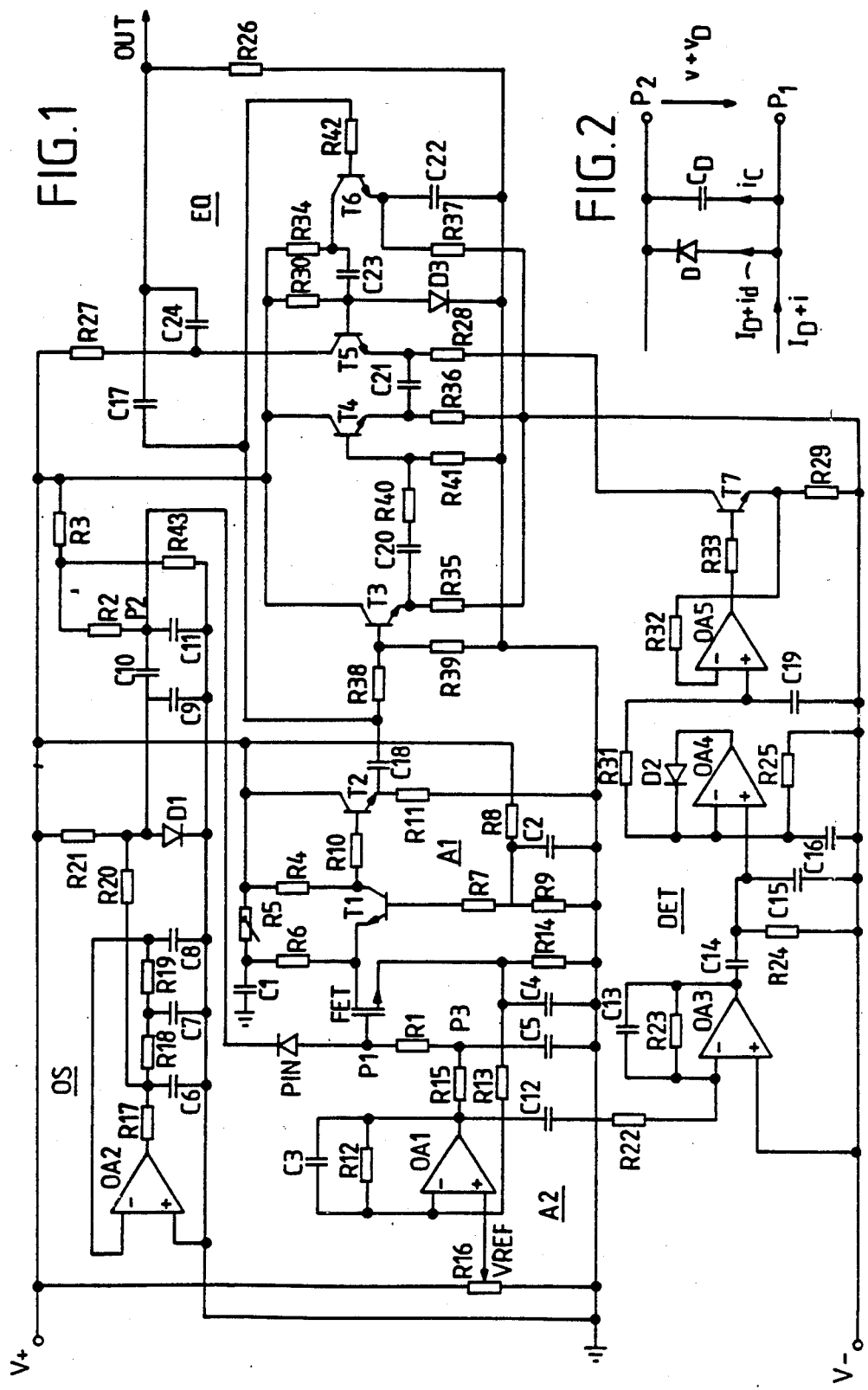

OPTICAL RECEIVER

The present invention relates to an optical receiver with a bias circuit adapted to reversely bias a photodiode.

Such an optical receiver is already known in the art, e.g. from the article "Optical Fiber Technology Detectors and Receivers" by G. Antell et al, Electrical Communication, Volume 56, No 4, 1981, pp 349–357.

The main characteristics of an optical receiver are its sensitivity and its dynamic range and both of these characteristics are not optimum in two known types of optical receivers, i.e. in high impedance receivers and in transimpedance receivers. Indeed, the former exhibit a relatively high sensitivity together with a relatively small dynamic range, whilst the latter on the contrary have a relatively smaller sensitivity but a higher dynamic range. The dynamic range is limited because at higher optical power values saturation of the receiver, e.g. of the bias circuit, occurs by the DC component of the higher photocurrent. Moreover, when the anode of the photodiode is coupled to the gate electrode of a field effect transistor (FET) forming part of an amplifier, it has been found that the operation of the receiver may be dependent on the FET used, i.e. on the gate-to-source voltage required to make it conductive and therefore also on the diode voltage.

An object of the present invention is to provide an optical receiver, such as described above, but which does not present the above drawbacks.

According to the invention this object is achieved due to the fact that said bias circuit for increasing optical power levels shifts the operating point of the photodiode towards and into the non-linear operating region of the photodiode which then becomes forwardly biased and for optical power levels above a predetermined value operates as a constant current source supplying a constant current to said photodiode.

When the photodiode becomes forwardly biased, a forward current starts flowing through it due to which the total DC current flowing in the bias circuit is automatically reduced and this circuit and/or other circuitry of the receiver are thus prevented from being saturated. On the other hand, due to the presence of the constant current source, the operating point of the photodiode shifts towards and into its nonlinear region independently of the diode voltage.

Another characteristic of the present optical receiver is that said bias circuit includes a transistor the emitter-to-collector path of which is coupled in series with a first resistance and said photodiode between the poles of a DC voltage supply source, the base of said transistor being connected to the tapping point of a voltage divider comprising second and third resistances also connected in series between said poles.

Still another characteristic of the present optical receiver is that one pole of said DC voltage supply source is connected via said first resistance to the emitter of said transistor which is a PNP transistor whose collector is connected to the cathode of said photodiode.

The bias circuit does not require the use of a high first resistance because the value of the constant current not only depends on the voltage drop in this first resistance but also on the voltage drop in the second resistance. The disadvantage of the use of a high resistance is that it occupies a relatively large space and has not always a high reliability.

The above mentioned and other objects and features of the invention will become more apparent and the invention itself will be best understood by referring to the following description of embodiments taken in conjunction with the accompanying drawings wherein:

FIG. 1 represents an optical receiver according to the invention and including a first embodiment of a photodiode bias circuit;

FIG. 2 is an equivalent circuit of the photodiode PIN of FIG. 1 when forwardly biased;

Figure 3:
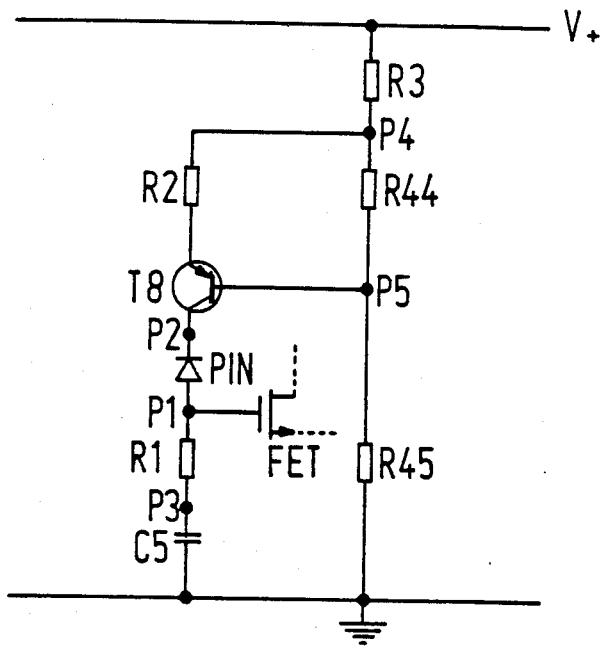
FIG. 3 represents a second embodiment of a photodiode bias circuit for use in an optical receiver according to FIG. 1.

The optical receiver shown in FIG. 1 is able to receive high frequency, e.g. 140 Mbit/sec., optical data signals and operates with voltages $V+ = 12$ Volts, $V- = -12$ Volts, ground, and $-20$ Volts (not shown) used as supply voltage for the operational amplifiers included in the amplifier. The receiver is of the high impedance type and includes a photodetector constituted by a P.I.N. (positive-intrinsic-negative) photodiode PIN, a n-channel field effect transistor FET constituting the input stage of an amplifier circuit A1, amplifier A2, a 200 Hz oscillator OS, a detector DET and an equalizer EQ. The anode of the photodiode PIN is connected in junction point P1 to the gate electrode of the FET whose source electrode is coupled to this gate electrode via a regulating negative feedback loop including the amplifier circuit A2 and a bias resistance R1 having a high value, e.g. 1 Megohm, in series. The cathode of the photodiode PIN is connected via resistor R2 to the tapping point of a voltage divider comprising resistors R3 and R43 which are connected in series between $V+$ and ground. The output of the oscillator OS whose input terminal is grounded, is coupled to the junction point P2 of R2 and PIN via a capacitor C10. The drain electrode of the FET is connected via the remaining part of amplifier circuit A1 to a signal input of the equalizer EQ whose output OUT constitutes the receiver output. An output of the amplifier circuit A2 is coupled to a control input of this equalizer EQ via the detector DET.

The amplifier circuit A1 of which the FET forms part includes a NPN transistor T1 which forms a cascode circuit with the FET. The supply voltage $V+$ is connected to the collector of T1 via resistor R4 and to the joined drain of the FET and the emitter of T1 via variable resistor R5 and resistor R6 in series, the junction point of R5 and R6 being grounded through the supply source decoupling capacitor C1. The base of T1 is connected via resistor R7 to the tapping point of a voltage divider comprising resistors R8 and R9 which are connected in series between $V+$ and ground. This tapping point is also connected to ground via decoupling capacitor C2 which maintains this point at ground for data signals. The supply voltage $V+$ is also connected to the collector of an emitter follower transistor T2 whose base is connected to the collector of transistor T1 through resistor R10 and whose emitter is grounded via resistor R11.

The amplifier circuit A2 includes an operational amplifier OA1 whose output is connected to its inverting input via resistor R12 and capacitor C3 in parallel, and this inverting input is also connected to the source electrode of the FET via resistor R13, the latter source electrode being connected to ground via resistor R14 and decoupling capacitor C4 in parallel. This capacitor C4 maintains the source of FET at ground for data signals. The output of OA1 is also connected via resistor R15 to the junction point P3 of bias resistor R1 and one plate of a capacitor C5 whose other plate is grounded. R15 and C5 together constitute a filter preventing OA1 from providing negative feedback to the data signals. The noninverting input of OA1 is connected to a tapping point of a potentiometer resistance R16 connected between V+ and ground and providing a reference voltage VREF.

The 200 Hz oscillator OS includes an operational amplifier OA2 whose non-inverting input is grounded and whose output is connected to its inverting input via the cascade connection of three cascaded cells each comprising a series resistor R17, R18 and R19 and a grounded shunt capacitor C6, C7 and C8 respectively. The components of each cell are so chosen that this cell produces a phase rotation of 60° for a frequency of 200 Hz signal only. Thus the three cells in series together produce a 180° phase rotation for this frequency. Because also OA2 realizes a 180° phase rotation a frequency of 200 Hz is submitted to a 360° or 0° phase rotation. On the contrary, other frequencies are submitted to a phase rotation different from 0°. The amplitude of the 200 Hz signal at the output of OA2 is for instance about 25 Volts peak-to-peak and that of the 200 Hz signal at the output of the first cell R17, C6 is e.g. about 12 Volts. The latter output is connected to ground via an attenuator comprising resistor R20 and diode D1 in series and providing for instance a 1 mV (RMS) output signal at the junction point of R20 and D1. This diode D1 is fed from V+ through resistor R21 and is connected in parallel with capacitor C9 used to remove harmonics from the attenuator output signal. The attenuator output is connected to the above mentioned junction point P2 via a 200 Hz coupling capacitor C10 forming a short-circuit for a 200 Hz signal and this junction point is also connected to ground via capacitor C11 which maintains point P2 at ground for the high frequency data signals.

The detector DET comprises the cascade connection of an amplifier and a peak detector proper. The amplifier includes an operational amplifier OA3 to the inverting input of which the ouput of OA1 is connected through a 200 Hz coupling capacitor C12 and resistor R22 in series. The noninverting input of OA3 is connected to V— and its output is connected to its inverting input via resistor R23 and capacitor C13 in parallel. The output of OA3 is connected to the non-inverting input of operational amplifier OA4 via a filter network comprising capacitor C14, shunt capacitor C15 and shunt resistor R24. R24 and C15 are both connected to V—. By a suitable choice of the components C12 to C14 and R22 to R24 a filtering action is performed on the 200 Hz signal supplied from the output of OA1 via capacitor C12. The operational amplifier OA4 forms part of the peak detector proper and its inverting input is connected to V— via a capacitor charge/discharge circuit comprising resistor R25 and capacitor C16 in parallel and its output is connected to the inverting input via diode D2.

The equalizer EQ includes a differentiator comprising series capacitor C17 and shunt resistance R26 the one ends of which are connected to the output terminal OUT. The output of the amplifier circuit A1 is connected to the other end of C17 via capacitor C18 and the other end of R26 is grounded. The equalizer includes compensation means associated to the differentiator C17, R26 to modify the operation thereof in function of the dynamic resistance and the diffusion capacitance of the PIN photodiode. These means include NPN transistors T3 to T7. The supply voltages V+ and V— are interconnected via resistor R27, the collector-to-emitter path of transistor T5, resistor R28, the collector-to-emitter path of transistor T7 and resistor R29 in series. The base of T5 is connected to the junction point of resistor R30 of e.g. 39 kilo-ohms and diode D3 which are connected in series between V+ and ground so that a predetermined DC bias current flows through this diode. Transistor T7 and resistor R29 form part of a voltage-to-current converter which further includes operational amplifier OA5 whose non-inverting input is connected to the inverting input of OA4 through resistor R31 and to ground via coupling capacitor C19. The emitter of T7 is connected to the inverting input of OA5 via resistor R32 and to V— via resistor R29, whilst the output of OA5 is connected to the base of T7 through resistor R33.

The collector of the transistors T3 and T4 which are connected as emitter follower are directly connected to V+, whilst the collector of T6 is connected to V+ via resistor R34 of e.g. 1 kilo-ohm. The emitters of T3, T4 and T6 are connected to V— through resistors R35, R36 and R37 respectively. The base of T3 is connected to the junction point of resistors R38 and R39 which are connected in series with data signal coupling capacitor C18 between the emitter of T2 and ground. Likewise, the base of T4 is connected to the junction point of resistors R40 and R41 which are connected in series with coupling capacitor C20 between the emitter of T3 and ground. The emitter of T4 is connected to that of T5 via data signal coupling capacitor C21 and the collector of T5 is connected to the junction point of C17 and R26 via coupling capacitor C24. The emitter of T6 is connected to ground through data signal coupling capacitor C22, whilst its collector is connected to the junction point of resistor R34 and data signal coupling capacitor C23 which are connected in parallel with resistor R30. The base of T6 is connected to the junction point of C17, C18 and R38 through resistor R42. The coupling capacitors C18 to C24 constitute short-circuits for the data signals.

The above described optical receiver operates as follows when high frequency, e.g. 140 Mbit/sec., optical data signals are supplied to the PIN photodiode.

The source current of the FET is maintaining at a constant value, e.g. 10 mA, by means of the regulating loop comprising the gate-to-source path of this FET, resistor R14 shunted by capacitor C4, amplifier A2 and resistor R1. Thus, also the gate-to-source DC voltage of the FET is maintained at a constant value.

When the above optical data signals are supplied to the PIN diode they are integrated in the input capacitance (not shown) at the gate of the FET. They are then amplified in amplifier A1 of which the FET forms part and supplied via capacitor C18 to the equalizer EQ at the output OUT of which equalised data signals appear.

The optical data signals generate in the PIN diode a photocurrent which has a DC component $I_p$ and an AC component $i_p$.

When calling I the DC current flowing in the internal circuit of the PIN diode and V1 the voltage at the junction point of the voltage divider R3, R43, the DC voltages VP2 and VP3 at the junction points P2 and P3 are given by:

$$VP2 = V1 - I.R2 \tag{1}$$

$$VP3 = VP1 - I.R1 \tag{2}$$

so that the reverse DC bias voltage applied across the PIN diode is $$VPIN = V1 - VP1 - I.R2 \tag{3}$$

both V1 and VP1 being substantially constant.

As long as the PIN diode is reversely biased, the current I is equal to the DC component $I_p$ of the photocurrent and therefore increases with increasing optical power supplied to the diodes, so that in this case both VP3 and VPIN decrease. However, as soon as the current I reaches a value such that the PIN diode becomes forwardly biased by the voltage drop over R2, a forward current $I_D + i$ starts flowing through this diode so that the current I is then equal to $I_p$ less the DC component $I_D$ of this forward current and is thus limited. In fact I then remains substantially constant. As a consequence also the voltage VP2, VP3 and VPIN remain substantially constant so that there is no danger neither for saturating the FET or/and subsequent circuitry nor for blocking the amplifier A2.

This is not so if resistor R2 were not present. Indeed, in this case the current I would not be limited so that for a certain value of this current the voltage VP3 would become substantially equal to the supply voltage of OA1 and from that moment on the gate voltage VP1 of the FET would increase and finally the latter would saturate.

As described above, the output of the oscillator OS is connected via coupling capacitor C10 and PIN diode in series to a parallel circuit one branch of which comprises the resistors R1 and R15 in series and the other branch of which is constituted by the gate-to-source path of FET and amplifier OA1 in series. The following relation may therefore be written when the gain of OA1 is much larger than $$\frac{R1 + R15}{r}: \tag{4}$$

$$VOA1 = VOS \cdot \frac{R1 + R15}{r}$$

wherein
VOA1 is the output voltage of OA1;
VOS is the 200 Hz output voltage of OS;
r is the dynamic resistance of the PIN diode.

As long as the PIN diode is reversely biased, i.e. for lower optical power values, e.g. below −20 dBm, the dynamic resistance r of this diode is much larger than R1+R15. As a consequence the output voltage VOA1 is then negligible so that the detector DET is then not operative and therefore does not affect the operation of the equalizer EQ. In this case only the differentiator circuit C17, R26 thereof is effective. On the contrary, when the PIN diode becomes forwardly biased the output voltage VOA1 of OA1 becomes sufficiently large because r becomes considerably smaller so that the detector DET is then operated. As a consequence thereof the equalizer is adjusted, as will be described later.

The equivalent circuit of the input circuit including the PIN diode and the associated FET includes a current source supplying a current $i_p$ (not shown) to a parallel circuit mainly including the resistance R1 and the input capacitance $C_{in}$ (not shown) at the gate of the FET.

To check the influence of the forwardly biased PIN diode reference is made to FIG. 2 which shows the equivalent circuit of this forwardly biased diode. The latter circuit comprises an impedance Z1 which shunts the last mentioned input capacitance constituted by a parallel circuit with a diode D having a relatively small dynamic resistance r and a so called diffusion capacitance $C_D$ which is proportional to the inverse of this dynamic resistance r of the diode D as well as to the current flowing through this diode. When calling i the AC component and $I_D$ the DC component flowing in the parallel circuit D, $C_D$ the following approximate relations may be written:

$$C_D = a(I_D + i_D) + \frac{b}{r} \tag{5}$$

wherein $i_D$ is the portion of i flowing through D, the current flowing through $C_D$ being equal to $i_C$; a and b are constants;

$$I_D + i_D = I_o \cdot e^{k(v + V_D)} \tag{6}$$

$$V_D = I_o \cdot e^{kV_D} \tag{7}$$

wherein
$I_o$ is the reverse diode saturation current;
k is a constant;
$V_D$ is the DC voltage across $C_D$, D. and $$i_C = C_D \cdot \frac{dv}{dt} \tag{8}$$

By taking the relations (5) to (8) into account the value of the current $I_D + i$ is given by:

$$I_D + i = I_D \cdot e^{kv}\left(1 + a\frac{dv}{dt}\right) \tag{9}$$

It should be noted that v not only is the AC data voltage across the PIN diode but also the AC voltage at the gage P1 of the FET because due to the presence of capacitor C11 point P2 is at ground potential for these data signals.

From the above and relation (9) it follows that the forwardly biased PIN diode constitutes an impedance Z1 which shunts the above mentioned input capacitance $C_{in}$ at the gate of the FET and through which flows the current $I_D + i$. When calling $Z_t$ the parallel impedance of this shunt impedance Z1 and the input capacitance $C_{in}$, then $v = Z_t \cdot i_p$ wherein $i_p$ is the total AC current as already mentioned. In order that the voltage at the output OUT of the receiver should be independent from the impedance $Z_1$, across the capacitor C17 should be branched an impedance Z2 through which flows a current proportional to the current $I_D + i$ flowing through Z1.

As described in detail hereinafter with this purpose a current $i3 + I3$ is derived from the junction point of C17 and R26 through transistor T5.

As mentioned above the AC voltage v is applied to the gate of the FET. Supposing that the gain of the amplifier A1 is equal to A, then the output voltage signal of A1 at the emitter of emitter follower transistor T2 is equal to $-Av$. This voltage signal is applied via capacitor C18 to a buffer comprising emitter follower transistor T3 and associated resistors. The voltage signal $-Av$ at the emitter of T3 is applied via capacitor C20 to the voltage divider comprising resistors R40 and R41 which have a value equal to $(A-1)R$ and R respectively. Consequenly the voltage signal at the base of emitter follower transistor T4 is equal to $-v$. This transistor T4 also acts as a buffer and provides the same voltage $-v$ at its emitter. Via capacitor C21 this voltage is applied to the emitter of transistor T5.

From FIG. 1 it also follows that the above output voltage $-Av$ of amplifier A1 is also applied to the base of transistor T6 and from there, via the base-to-emitter junction of this transistor to the upper plate of capacitor C22 whose lower plate is grounded. As a consequence an AC current $-i1$ flows through this capacitor c22, the current i1 being substantially equal to $$i1 = C22 \cdot \frac{dAv}{dt} \tag{10}$$

With the above given values of the resistors R30 and R34, the collector impedance of transistor T6 is mainly constituted by diode D3 so that an AC current substantially equal to i1 flows through this diode. This AC current is superimposed on the DC bias current I1 which continuously flows from V+ to ground via resistor R30 and diode D3 in series. The current i1+I1 produces across diode D3 a voltage u+U given by the following relation:

$$i1 + I1 = I_o \cdot e^{k(u+U)} \tag{11}$$

wherein
$I_o$ is the diode reverse saturation current;
u is the AC voltage across D3;
U is the DC voltage across D3.
Because $$I1 = I_o \cdot e^{kU} \tag{12}$$

it follows from the relations (11) and (12) that $$e^{ku} = \frac{i1 + I1}{I1} \tag{13}$$

To be noted that the diode D3 is used in order that notwithstanding the non-linear behaviour of the base-emitter junction diode of T5 the current i1 should flow therein. Indeed, this current produces across the diode D3 a non-linear voltage u which gives rise to the same current i1 in the base-to-emitter junction of T5.

As already described above, the 200 Hz output voltage VOA1 of operational amplifier OA1 is given by relation (4) and this voltage is not negligible when the dynamic resistance r of the PIN diode is relatively small, as is supposed. This output voltage VOA1 is applied to the detector DET and more particularly to the circuit including operational amplifier OA3 which acts as a filter for the 200 Hz frequency. The thus filtered 200 Hz signal is applied to the peak detector proper including operational amplifier OA4. Therein the filtering 200 Hz signal is converted into a DC voltage $V_p$ with an amplitude equal to the peaks of the input signal. In the voltage-to-current switch including operational amplifier OA5 and transistor T7 the voltage $V_p$ is converted into a DC current $$I2 = \frac{V_p}{R29} \tag{14}$$

Because $V_p$ corresponds to the mean value of the 200 Hz input signal VOA1 and also of the 200 Hz signal VOS as follows from relation (4), the current I2 is proportional to mean value of the inverse of the dynamic diode resistance r.

Instead of using a peak detector also a mean value detector could be used since the purpose is to obtain a DC voltage signal which is proportional to the 200 Hz signal amplitude.

Independently from the value of U, the current I2 produces across the base-emitter junction of transistor T5 a DC voltage V2 given by $$I2 = I_o \cdot e^{kV2} \tag{15}$$

Therefore the total voltage applied across the junction is equal to $u+v+V2$. Indeed, as described above the voltages u and $-v$ are applied to the base and emitter of T5 respectively. As a result of this above voltage $u+v+V2$ a current $i3+I3$ is generated in the base-emitter junction diode of transistor T5 and also in the collector thereof. This current is given by the relation $$i3 + I3 = I_o \cdot e^{k(u+v+V2)} \tag{16}$$

From the relations (13) and (16) it follows $$i3 + I3 = IO \frac{i1 + I1}{I1} e^{kv} \cdot e^{kV2} \tag{17}$$

and from the relations (10), (15) and (17) it follows $$i_3 + I3 = I2 \cdot e^{kv} \cdot \left(1 + \frac{A \cdot C22}{I1} \frac{dv}{dt}\right) \tag{18}$$

As mentioned with respect to relation (14) the current I2 is proportional to the mean value of the inverse $1/r$ of the dynamic diode resistance. From relation (5) it follows that the mean value of $1/r$ is equal to $I_D$. Consequently I2 is proportional to $I_D$. For instance:

$$I2 = m \cdot I_D \tag{19}$$

wherein m is a constant.
From the relations (18) and (19) follows $$i_3 + I3 = m \cdot I_D \cdot e^{kv} \left(1 + \frac{A \cdot C22}{I1} \frac{dv}{dt}\right) \tag{20}$$

When $$\frac{A \cdot C22}{I1} = a$$

the relations (9) and (20) are equal when not taking the constant f into account. In this case the capacitor C17 is shunted by an impedance which is equal to Z1/m wherein Z1 is the impedance shunting the input capacitance $C_{in}$ at the gate of the FET, as already mentioned.

The voltage with absolute value Av is applied to the parallel connection of Z1/m and C17 which forms an impedance Z't so that when Z't is much larger than the value of R26 the voltage VOUT developed across R26 is equal to $$R26 \cdot \frac{Av}{Z't}.$$

Because $v = Zt \cdot i_p$ and when choosing C17 = $mC_{in}$, VOUT becomes proportional to $i_p$, as required.

Reference is now made to FIG. 3 which shows a second embodiment of a circuit for biasing the photodiode PIN. This circuit is similar to the one represented in FIG. 1, but now includes a constant current source comprising PNP transistor T8 and a low impedance voltage divider comprising transistors R2 and R44, R45 (instead of R43) which are connected in series between V+ and ground. The tapping point P4 of this voltage divider is connected to the cathode P2 of the diode PIN via resistor R2 and the emitter-to-collector path of transistor T8 in series. The base of transistor T8 is connected to the junction point P5 of the resistors R44 and R45.

Typical values of the resistors are:
R2: 910 kilo-ohms
R3: 10 kilo-ohms
R44: 1.5 kilo-ohms
R45: 3.6 kilo-ohms so that the voltages $V_{p4}$ and $V_{p5}$ at the tapping points P4 and P5 are substantially constant.

When calling $$V_d = \frac{V_{P4} \cdot R44}{R44 + R45} \quad (21)$$

the voltage drop across resistor R44, the constant collector current $I_c$ able to be supplied by the transistor T8 is given by the relation $$I_c = \frac{b}{b+1} \cdot \frac{V_d - |V_{BE}|}{R2} \quad (22)$$

wherein b is the current amplification factor.

For lower optical power values the PIN diode is reversely biased and the current I flowing in the outside circuit of this diode is equal to the DC component $I_p$ of the photocurrent, this current increasing with optical power. This remains so as long as I is smaller than the above mentioned constant current $I_c$ and in this case transistor T8 is in the saturated condition. The collector voltage applied to the cathode of the PIN diode is then equal to $$V_c = V_{p5} + |V_{BE}| - |V_{CEsat}| \quad (23)$$

Figure 4:
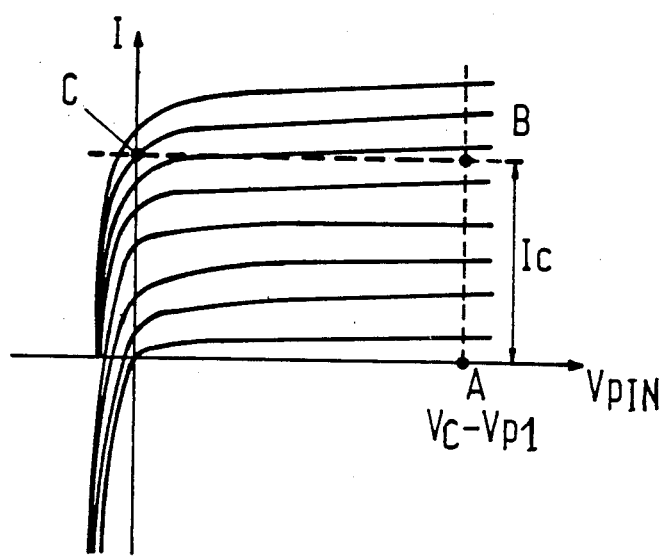
FIG. 4 shows the current versus bias voltage characteristic of this photodiode for various values of the optical power level.

Because $V_{p5}$, $V_{BE}$ and $V_{CEsat}$ are substantially constant also $V_c$ is constant so that a constant reverse bias voltage $$V_{PIN} = V_c - V_{p1} \quad (24)$$

is then applied across the diode. For increasing optical power values remaining below that at point B for which $I = I_c$ the operating point of the diode shifts along the vertical line AB, respresented in characteristic I versus $V_{PIN}$ in FIG. 4.

When the current $I_p$ reaches the value $I_c$ then the operation point of the diode follows the horizontal line BC and the bias voltage decreases until it reaches a value for which a forward current starts flowing in this diode. The diode is then forwardly biased and operates in its non-linear region. As explained above in relation to FIGS. 1 and 2 this is required to extend the dynamic range of the optical receiver.

While the principle of the invention have been described above in connection with specific apparatus, it is to be clearly understood that this description is made only by way of example and not as a limitation on the scope of the invention.

I claim:

1. An optical receiver comprising:
   a photodiode having a cathode and an anode, and
   a bias circuit, said bias circuit comprising:
   first means for shifting the operating point of the photodiode towards and into the non-linear operating region thereof at higher optical power levels to thereby forwardly bias said photodiode at said higher optical power levels, and
   second means for reversely biasing said photodiode at lower optical power levels, said second means operating as a constant current source and supplying a constant current to said photodiode at optical power levels above a predetermined value.

2. An optical receiver according to claim 1, wherein said second means supplies a substantially constant voltage to said photodiode at optical power levels below said predetermined value.

3. An optical receiver according to claim 2, wherein said bias circuit second means further comprises:
   a first transistor having an emitter, a collecter and a base, an emitter-to-collector path being defined between said emitter and said collector, said emitter-to-collector path being coupled to said photodiode;
   a first resistance also coupled to said photodiode;
   a DC voltage supply source having first and second poles,
   said first transistor and said first resistance and said photodiode being coupled in series between said first and second poles, and
   a voltage divider comprising
   a second resistance and
   a third resistance,
   said second and third resistances being connected in series between said first and second poles so as to define a tapping point,
   said base of said first transistor being connected to said tapping point.

4. An optical receiver according to claim 3, wherein:
   a positive one of poles of said DC voltage supply source is connected via said first resistance to said emitter of said first transistor and
   said first transistor is a PNP transistor whose said collector is connected to said cathode of said photodiode.

5. An optical receiver comprising:
   a photodiode having a cathode and an anode with an inherent first impedance (Z1) therebetween, said inherent first impedance including
   a relatively small dynamic resistance (r) associated with an equivalent diode of said photodiode and
   a diffusion capacitance ($C_D$) dependent on said dynamic resistance (r) and on a first current equal to the current ($I_D + i_D$) through said equivalent diode (D);

bias circuit means for shifting the operating point of said photodiode towards and into a non-linear operating region thereof at increasing optical power levels to thereby forwardly bias said photodiode at said increasing optical power levels, and compensating means for compensating for said diffusion capacitance and said relatively small dynamic resistance of said photodiode.

6. An optical receiver according to claim 5, wherein said receiver has a receiver output and said compensating means provides a second impendance (Z1/m) which is proportional to said first impedance (Z1) and is coupled between said bias circuit means and said receiver output.

7. An optical receiver according to claim 6, wherein said receiver further comprises a first amplifier circuit, and an equalizer which includes a differentiator circuit comprising a first resistance, and a first capacitance, said first capacitance and said second impedance (Z1/m) being branched in parallel from a junction point, and wherein said bias circuit means has a high third impedance and is coupled to said receiver output via a series connection of said first amplifier circuit and said equalizer.

8. An optical receiver according to claim 7, wherein said compensating means includes measuring means to measure said dynamic resistance (r) and to provide a measuring means output signal related to said dynamic resistance (r).

9. An optical receiver according to claim 8, wherein said compensating means includes means for converting said measuring means output signal into a DC fourth current proportional to the mean value of the inverse of said dynamic resistance (r) and to a DC fifth current ($I_D$) flowing through said equivalent diode (D).

10. An optical receiver according to claim 9, wherein said means for converting includes a peak detector whose input is coupled to said second ampiflier circuit output and which operates on said output signal and a voltage-to-current converter for providing said DC fifth current, said peak detector being connected in cascade to said voltageto-current converter.

11. An optical receiver according to claim 10, wherein said optical receiver further comprises:

a second transistor having an emitter coupled to the output of said voltage-to-current converter;

first means to apply across the base-emitter junction diode of said second transistor a first AC voltage proportional to a voltage across said first impedance, and second means to apply to said second transistor a second AC voltage giving rise in said base-emitter junction diode to a fifth current proportional to a sixth current ($i_{CD}$) flowing in said diffusion capacitance ($C_D$).

12. An optical receiver according to claim 11, wherein said first means includes a voltage divider to derive said first AC voltage from the output signal of said first amplifier circuit.

13. An optical receiver according to claim 11, wherein said second means includes a third transistor to the base of which the output signal of said first amplifier circuit is applied and whose emitter circuit includes a second capacitance, the collector circuit of said third transistor including a second diode whose anode is connected to the base of said second transistor.

14. An optical receiver according to claim 8, wherein said measuring means includes an oscillator, a second amplifier circuit having an amplifier output and an amplifier input, a first transistor and a fourth impedance, said oscillator being coupled to said cathode of said photodiode, said anode of said photodiode being coupled to said input of said second amplifier circuit via said first transistor, the series connection of said second amplifier circuit and said first transistor being shunted by said fourth impedance, said measuring means output signal being provided at said output of said second amplifier circuit and being proportional to the inverse of said dynamic resistance (r), said first transistor being a field effect transistor.

15. An optical receiver according to claim 14, wherein said first amplifier circuit includes said first transistor and said second amplifier circuit, said first transistor and said fourth impedance also form part of a regulating loop to maintain the source current of said first transistor substantially constant.

16. An optical receiver according to claim 7, wherein said compensating means is adapted to derive from said junction point of said first capacitance and said first resistance a second current proportional to a third current ($I_D+i$) flowing through said first impedance (Z1).

* * * * *

UNITED STATES PATENT AND TRADEMARK OFFICE
CERTIFICATE OF CORRECTION

PATENT NO. : 4,759,081

DATED : July 19, 1988

INVENTOR(S) : Witters

It is certified that error appears in the above-identified patent and that said Letters Patent is hereby corrected as shown below:

In the Specification

Column 6 Line 20    Before "$\underline{b}_r$" delete "+"

Column 6 Line 48    Delete "gage" and insert therefor -- gate --

Column 7 Line 9     Delete "consequenly" and insert therefor -- consequently --

Column 11 Line 11   Change "impendance" to -- impedance --

Column 11 Line 48   Change "voltageto-current" to -- voltage-to-current --

Signed and Sealed this

Thirteenth Day of December, 1988

Attest:

DONALD J. QUIGG

Attesting Officer   Commissioner of Patents and Trademarks